United States Patent
Alt et al.

(10) Patent No.: US 6,920,582 B2
(45) Date of Patent: Jul. 19, 2005

(54) METHOD AND APPARATUS FOR TESTING CIRCUIT MODULES

(75) Inventors: Juergen Alt, Holzkirchen (DE); Frederic Valentin, Bry sur Marne (FR)

(73) Assignee: Infineon Technologies AG, München (DE)

(*) Notice: Subject to any disclaimer, the term of this patent is extended or adjusted under 35 U.S.C. 154(b) by 455 days.

(21) Appl. No.: 10/099,062

(22) Filed: Mar. 15, 2002

(65) Prior Publication Data

US 2002/0199143 A1 Dec. 26, 2002

(30) Foreign Application Priority Data

Mar. 15, 2001 (DE) .......................................... 101 12 560

(51) Int. Cl.[7] .............................................. G06F 11/00
(52) U.S. Cl. ......................................... 714/30; 714/37
(58) Field of Search ..................................... 714/30, 37

(56) References Cited

U.S. PATENT DOCUMENTS 5,961,653 A * 10/1999 Kalter et al. .................... 714/7
6,661,266 B1 * 12/2003 Variyam et al. ............. 327/159
6,662,313 B1 * 12/2003 Swanson et al. .............. 714/39
6,691,252 B2 * 2/2004 Hughes et al. ................ 714/30

* cited by examiner

Primary Examiner—Robert Beausoliel
Assistant Examiner—Timothy M. Bonura
(74) Attorney, Agent, or Firm—Schiff Hardin LLP

(57) ABSTRACT

A method and apparatus for testing by sampling vectors circuit modules designated as channel models or as control modules and containing scan chains. Use is made of a test register which provides at least one control sampling mode signal for control modules and furthermore provides at least one channel sampling mode signal for channel modules. Channel modules and control modules can occur as circuit modules multiply with identical scan chains, enabling efficient testing in a manner that saves memory space. A logic is designed for the read-out of sampling output signals after testing of the scan chains via a read-out terminal unit of a test device, thus providing a comparison with desired sampling output signals for channel modules or for control modules in a comparator unit.

9 Claims, 4 Drawing Sheets

METHOD AND APPARATUS FOR TESTING CIRCUIT MODULES

BACKGROUND OF THE INVENTION

The present invention generally relates to a method for testing circuit modules, and in particular relates to a method for testing circuit modules which is used in a test device for sampling testing.

Testing of integrated circuits (ICs) and other assemblies is acquiring ever greater importance against the background of increasing miniaturization. By way of example, microprocessors are highly complex ICs which must be tested exactly for malfunctions, in particular for a use in central processing units (CPUs). However, there are numerous further applications for sampling testing of electronic circuit modules.

Circuit modules are constructed, for example, from scan chains which are provided by a series of logical functional units such as e.g. gate units and/or flip-flop units. These scan chains are conventionally tested by applying sampling vectors, which are constructed from a bit pattern sequence of logic "ones" and logic "zeros", to an input of a circuit module to be tested, and then, at an output, comparing the resulting sampling vectors with an expected result, for example with a desired sampling vector.

In this case, sampling vectors which are fed to an input of a circuit module to be tested are provided as sampling input signals, while resulting sampling vectors which are output by an output of the circuit module to be tested are compared as sampling output signals with expected result sampling vectors, which are referred to as desired sampling output signals, in a comparator unit.

In the testing of circuit modules, a test device is conventionally set up for sampling testing, in which case a test quality must be maintained even in the event of the test requirement being extended.

With the aid of a so-called ATPG software (Automated Test Pattern Generation software), specific digital test signals for testing circuit modules, which may be designed for example as "channel modules" or as "control modules", are generated by a test pattern generator. These test signals, which are prescribed as an arbitrary bit pattern sequence (e.g. 0-1-0-0-1-1-0-1- . . . ) in the form of sampling vectors, are fed to the circuit modules to be tested.

The terms "channel module" and "control module" hereinafter merely designate different circuit modules. Here, the term channel module designates a circuit module which generally occurs multiply, but at least once, in a circuit and in which case individual channel modules are each identical. And here, the term control module designates a circuit module which occurs multiply, but at least once, in a circuit and in which case once again individual control modules are each identical.

FIG. 1 shows a test device for channel modules $101a, \ldots 101i, \ldots 101d$ arranged in parallel according to the prior art. A first terminal unit 401 is connected to a control module 102, in which case signals can be exchanged between the first terminal unit 401 and the control module 102 in both directions as sampling input signals and sampling output signals. By way of example, FIG. 1 illustrates four channel modules $101a$, $101b$, $101c$ and $101d$ which are tested in a parallel manner. The channel modules $101a$–$101d$ are each connected to the control module 102 and a second terminal unit 402, in which case channel sampling input signals and channel sampling output signals can each be exchanged between the channel modules $101a$–$101d$ and the control module 102 or the second terminal unit 402.

The circuit modules present in a circuit, in this case designated as "channel modules" or as "control modules", comprise scan chains, e.g. for a channel module $101a$ the scan chains $A_{31}$–$A_{3N}$, which are formed for example by a series of flip-flop units, where N denotes the total number of scan chains in the channel module $101a$.

In this case, the sampling signals (sampling input signal and sampling output signal) which are generated in a test generator 112 are used to test a number of N scan chains ($A_{31}$–$A_N$) of which the respective circuit modules are composed. Test methods according to the prior art are based on a use of sampling input signals which have to be present, and also stored, separately for each circuit module (in this case channel modules and control modules). The respective sampling output signals are fed to a comparator unit 113 in which the respective sampling output signals are compared with desired sampling output signals, and a test result is thus obtained.

In order to provide sampling input signals in the event of circuits being extended by individual circuit modules, a memory extension of the test device is disadvantageously required in the case of test devices for sampling testing according to the prior art. However, if such a memory extension cannot be provided, sampling signals must necessarily be reduced, which leads to a disadvantage of a reduced test quality.

SUMMARY OF THE INVENTION

It is an object of the present invention to provide a test arrangement which can be used without an extension of the test device with regard to a memory or other components and without a limitation of the sampling signals for sampling testing.

In a method and apparatus of the invention for testing circuit modules, at least one channel module is driven by a test register. At least one control module is driven by the test register. The at least one channel module is tested by testing at least one scan chain of the channel module. The at least one control module is tested by testing at least one scan chain of the control module. Multiply present chain modules which have a substantially identical scan chain structure are in each case tested with substantially identical chain sampling input signals in that chain sampling output signals obtained at a respective chain sampling output are combined in a manner dependent on chain sampling mode signals by gate units in such a way that the channel sampling output signals obtained can be fed temporally successively to a combination unit, the combination unit, being designed such that one of the gate output signals is switched through. An output signal of the combination unit is switched through to a single readout terminal unit by means of a multiplexer unit in a manner dependent on a multiplexer sampling enable signal. Sampling enable signals are generated by an AND combination by means of a first gate unit and a second gate unit in that the sampling mode signals corresponding to the circuit modules to be tested are fed to a second input terminal of the gate units. Test results are read out via the read-out terminal unit. Test results obtained are compared with at least one desired sampling output signal for the tested channel modules by a means of a comparator unit.

Some of the exemplary embodiments of the invention are illustrated in the drawings and are explained in more detail in the description below.

DESCRIPTION OF THE PREFERRED EMBODIMENTS

Figure 1:
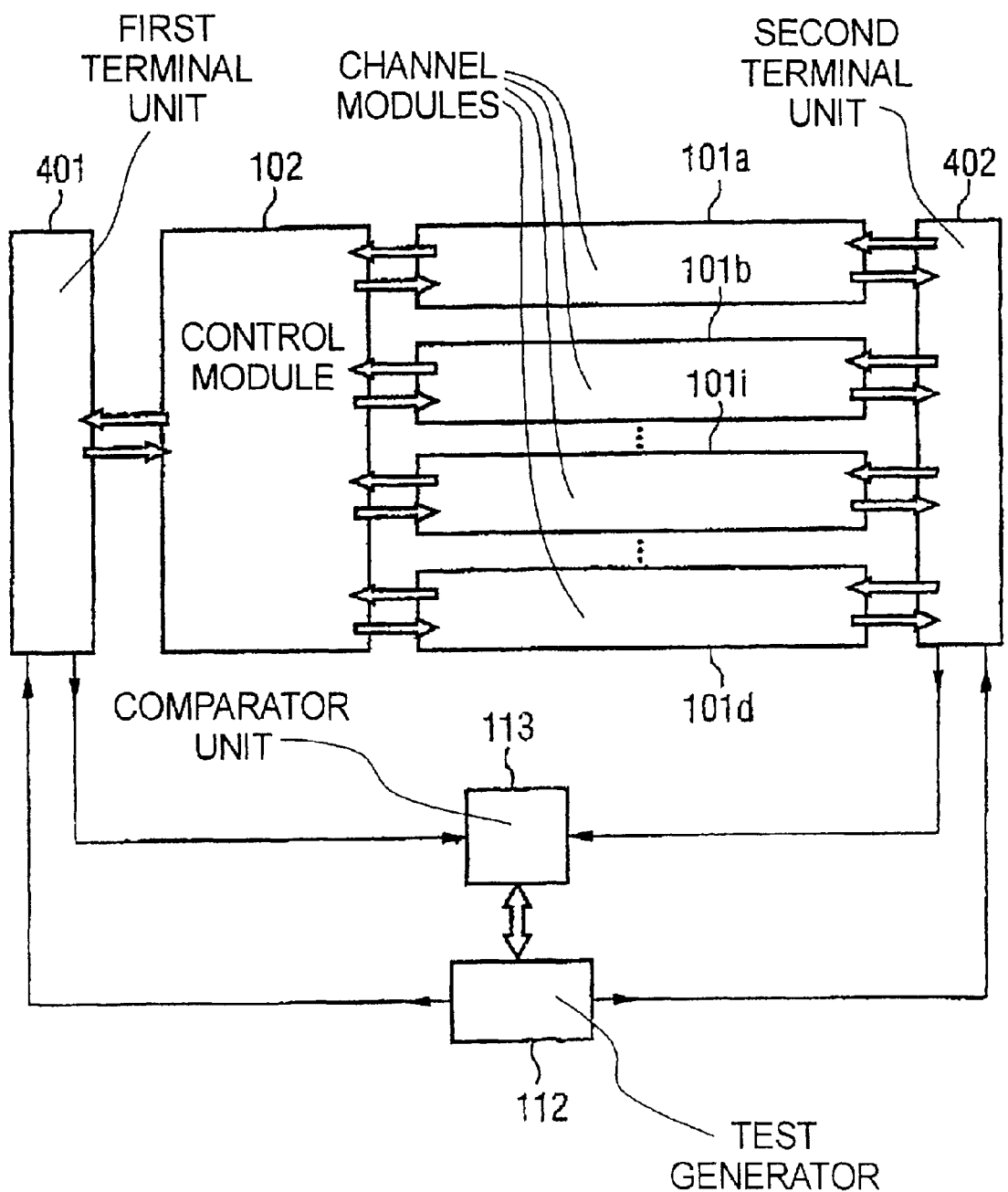
FIG. 1 shows a test device for testing circuit modules according to the prior art.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

A method is disclosed which makes it possible to store sampling signals in a test device and to use these stored sampling input signals to test scan chains which occur at least once in at least one circuit module, the method furthermore providing a read-out of channel sampling output signals via a single read-out terminal unit.

One advantage of the method for testing circuit modules is that at least one channel module (or at least one control module) can be tested in sampling testing in each case in parallel with identical channel sampling input signals (or with identical control sampling input signals, which leads to a reduction of a test time in a test device.

Sampling signals for a channel module are stored once in a test device and are provided multiply for test circuit modules.

The method can make it possible to reduce the memory requirement for storing sampling signals, which leads to a reduction of costs.

An apparatus for testing circuit modules can result in a reduced circuit size of the test device, thereby facilitating processing by a so-called ATPG software (Automated Test Pattern Generation software).

It can be an advantage of the method for testing circuit modules that sampling signals can be read out via a single read-out terminal unit after testing of all the scan chains.

In one embodiment, a test register is provided which drives individual channel modules and individual control modules.

In another embodiment, the at least one channel module and the at least one control module are tested serially.

In accordance with another embodiment, the at least one channel module and the at least one control module are tested in parallel.

In accordance with another embodiment, sampling signals are generated with the aid of a program for the automatic generation of test patterns, i.e. a so-called ATPG software (Automated Test Pattern Generation software).

In accordance with another embodiment, channel sampling output signals of individual channel modules are correlated with channel sampling mode signals in gate units in order to be fed to a combination unit.

In accordance with another embodiment, the gate units for combining the channel sampling mode signals with the channel sampling output signals are designed as AND gates.

In accordance with another embodiment, the combination unit is designed in such a way that only one of the gate output signals is switched through.

In accordance with another embodiment, an enable signal is fed to a first and a second gate unit, thereby enabling testing of a desired channel module with the aid of the corresponding channel sampling mode signal and testing of a desired control module with the aid of the corresponding control sampling mode signal.

FIG. 1 shows a schematic sketch of the method and of the apparatus for testing circuit modules in accordance with an exemplary embodiment of the present invention.

Figure 2:
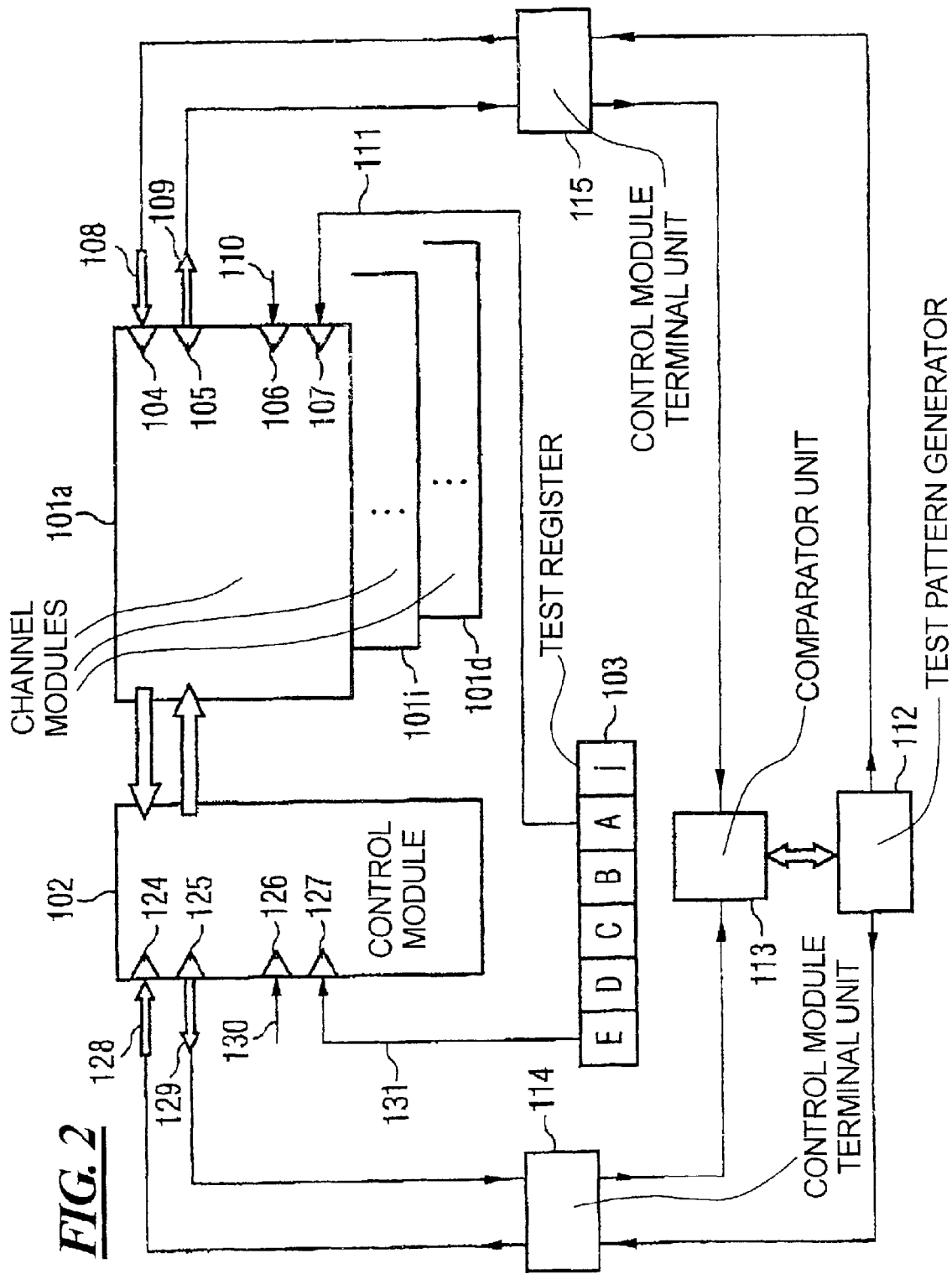
FIG. 2 shows a schematic sketch of an arrangement for testing circuit modules in accordance with an exemplary embodiment.

The test arrangement shown in FIG. 2 shows the testing of a plurality of channel modules 101*a*, . . . 101*i*, . . . 101*d* (i=running index) and of a control module 102. In this case, use is made of a test register 103, which, for driving the control module 102, provides a control sampling mode signal 131 for the control module 102 and, furthermore, for driving the channel modules 101*a*–101*d*, provides a channel sampling mode signal 111 for the channel modules 101*a*–101*d*. In the list of reference symbols, "i" in this case represents a running index which is applied to the channel modules 101*a*–101*d* or to more than four channel modules 101, if present.

It should be pointed out that four channel modules 101*a*–101*d* are tested in the exemplary embodiment illustrated in FIG. 2, but that the embodiment is not restricted to a number of four channel modules to be tested.

Figure 3:
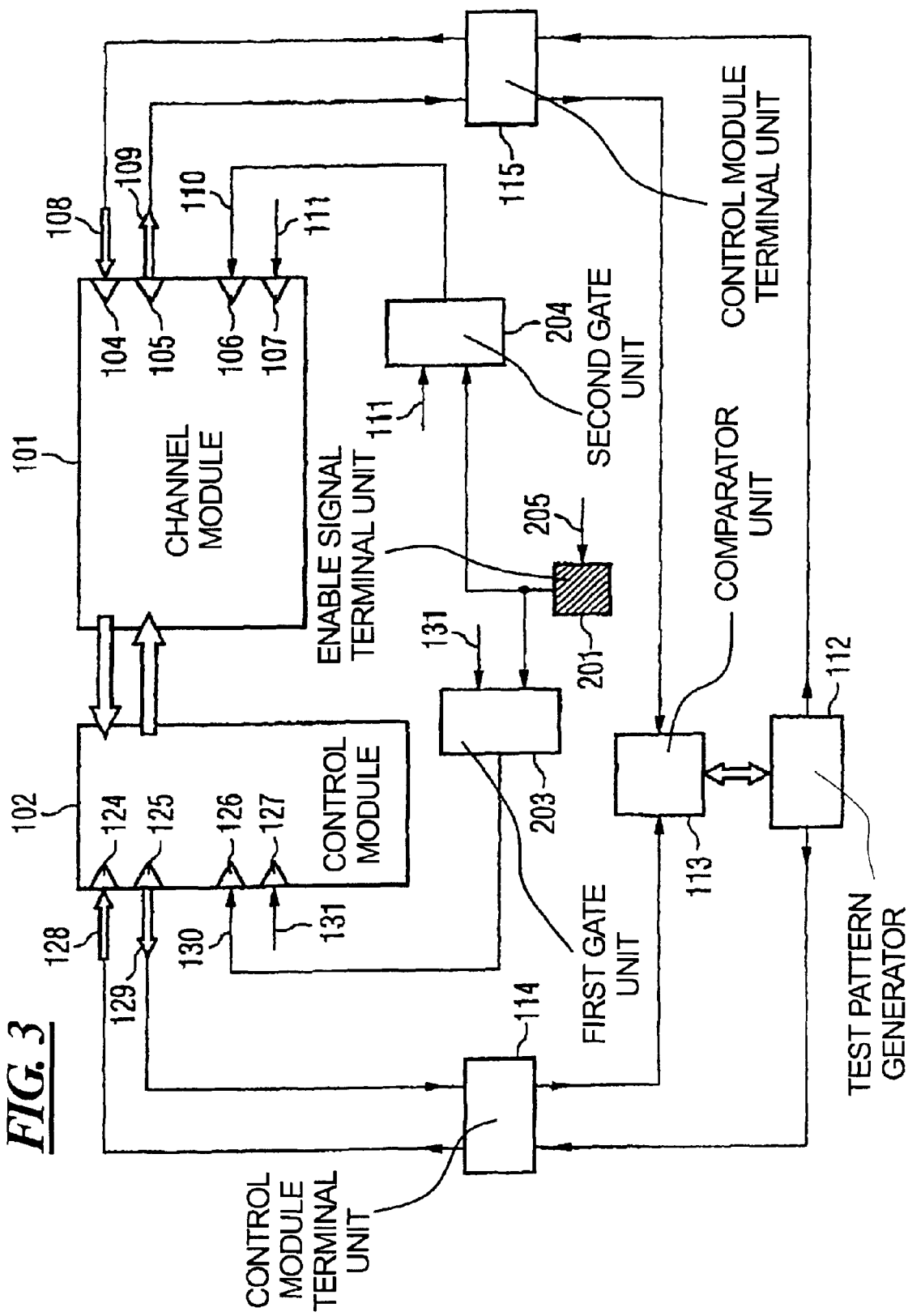
FIG. 3 shows an illustration of a test arrangement using a logic for providing sampling enable signals with the aid of the separate sampling mode signals shown in FIG. 2 in accordance with an exemplary embodiment.
Figure 4:
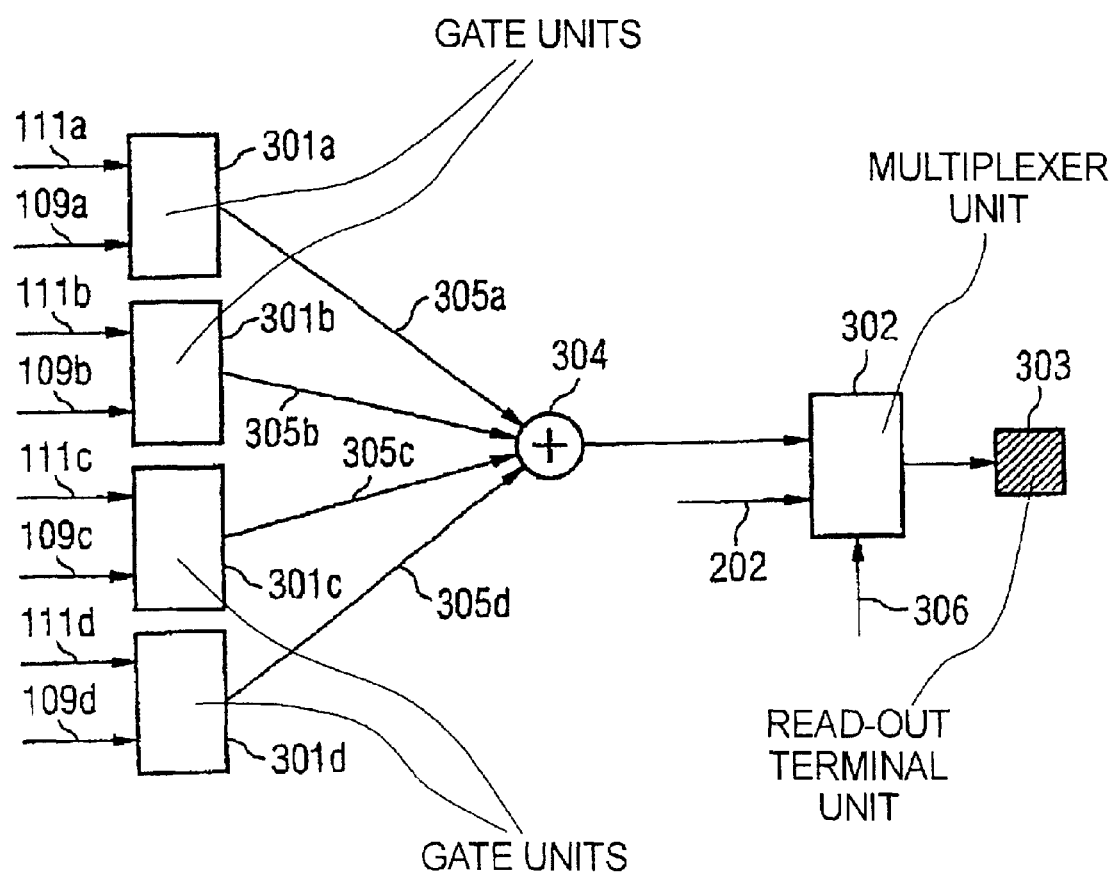
FIG. 4 shows a basic illustration of a logic for the read-out of sampling signals after testing of all the scan chains, the sampling signals being provided via a read-out terminal unit of a test device.

In the present disclosure, with specific reference to FIGS. 2 to 4, sampling signals are designated as channel sampling input signals 108 or control sampling input signals 128 if they are fed for testing purposes to a channel module 101 or a control module 102, respectively, while sampling signals are designated as channel sampling output signals 109 or control sampling output signals 129 if, after testing of a channel module 101 or of a control module 102, they are respectively read out from them.

A test pattern generator 112 feeds, as test signals which are prescribed as an arbitrary bit pattern sequence (e.g. 0-1-0-0-1-1-0-1- . . . ), i.e. as so-called sampling vectors, sampling input signals to the circuit modules to be tested, i.e. to a control module 102 via a control module terminal unit 114 and to a channel module 101 via a channel module terminal unit 115. The resulting sampling output signals are fed to a comparator unit 113, in which said signals are compared with corresponding desired sampling output signals.

The test register 103 feeds a channel sampling mode signal 111 to the channel module 101 at a channel sampling mode input 107. A channel sampling enable signal 110 is fed to a channel sampling enable input 106. A channel sampling input signal 108 is fed to the channel sampling input 104 of the channel module 101. A channel sampling output signal 109 is derived from the channel sampling output 105.

In a similar manner, the test register 103 feeds a control sampling mode signal 131 to the control module 102 at a control sampling mode input 127. A control sampling enable signal 130 is fed to the control sampling enable input 126 of the control module 103. A control sampling input signal 128 is fed to a control sampling input 124 of the control module 102. The control sampling output signal 129 is derived from a control sampling output 125 of the control module 102.

By way of example, five subunits A, B, C, D and E are illustrated in the test register 103 shown in FIG. 2, which subunits provide respective channel sampling mode signals 111a, 111b, 111c and 111d and also the control sampling mode signal 131. It should be pointed out, however, that, in principle, more than four channel modules 101 which are used multiply in a circuit arrangement and, in principle, more than one control module 102 may be contained.

In the illustrated exemplary embodiment, it is possible to store sampling signals for a channel module 101 singly in the test device and then to reuse them, as a result of which a test device having a small amount of memory may be provided.

Furthermore, an embodiment of the method makes it possible for all of the channel modules 101 present, in this case the four channel modules 101a, 101b, 101c and 101d illustrated, to be tested in parallel.

FIG. 3 illustrates a test arrangement using a logic for providing sampling enable signals, i.e. a control sampling enable signal 130 for a control module 102 and a channel sampling enable signal 110 for a channel module 101, with the aid of the separate sampling mode signals shown in FIG. 1, i.e. with a control sampling mode signal 131 for a control module 102 and a channel sampling mode signal 111 for a channel module 101, in accordance with an example embodiment.

In the case of the test arrangement shown in FIG. 2, an enable signal 205 is fed to an enable signal terminal unit 201. The enable signal 205 is furthermore fed in each case to a first terminal of a first gate unit 203 and to a first terminal of a second gate unit 204, which are designed as AND gates. The control sampling mode signal 131 is fed to a second terminal of the first gate unit 103, while the channel sampling mode signal 111 is fed to a second terminal of the second gate unit 204.

As an output signal of the first gate unit 203, the control sampling enable signal 130 is fed to the control sampling enable input 126 of the control module 102, while the channel sampling enable signal 110 is fed as output signal of the second gate unit 204 to the channel sampling enable input 106 of the channel module 101.

FIG. 4 illustrates, byway of example, a basic illustration of a logic arrangement for the read-out of channel sampling output signals 109a–109d after testing of all the scan chains of four channel modules 101a–101d via a single read-out terminal unit 303 of a test device in accordance with the method according to the invention.

In the case of the logic arrangement shown in FIG. 4, channel sampling input signals 108 have been applied by way of example, to four channel modules 101a, 101b, 101c and 101d, as a result of which channel sampling output signals 109a, 109b, 109c and 109d are provided at the respective channel sampling outputs 105, which are in turn respectively fed to first terminals of the gate units 301a, 301b, 301c and 301d shown in FIG. 4. The gate units 301a–301d are designed as AND gates, for example. Channel sampling mode signals 111a, 111b, 111c and 111d are applied to respective second terminals of the gate units 301a–301d. The gate output signals 305a–305d of the gate units 301a–301d are each fed to a combination unit 304, whose output is connected to a second input of the multiplexer unit 302.

In a manner dependent on a multiplexer sampling enable signal 206, the multiplexer unit 302 switches through to a read-out terminal unit 303 either the supplied normal function signal 202, which corresponds to a normal operation of the circuit arrangement, or the output signal of the combination unit 204, which in turn corresponds to a test operation for the circuit arrangement. Consequently, there is the advantage that all the sampling signals can be read out via a single read-out terminal unit 303 of the test device after testing of all the scan chains.

The embodiment of the method for testing circuit modules thus makes it possible to eliminate the disadvantage of conventional methods for testing circuit modules in which a test device has to be enlarged when the sampling signals are increased. Furthermore, in the method for testing circuit modules, there is no need to accept limitations with regard to the sampling signals for sampling testing or a reduction of the test quality. An example of how the method for testing circuit modules provides a reduction of a quantity of sampling signals will be described below.

In an illustrative example, each of the channel modules 101a, 101b, 101c and 101d and also the control module 102 contains, 2500 flip-flop units, which means that there are a total of 12,500 flip-flop units present which must be connected by scan chains. Furthermore, it shall be assumed that, on the basis of available terminal units of the channel modules 101 and of the control module 102, only 10 scan chains can be provided.

Moreover, 1000 sampling vectors are determined by the program for automatic generation of test patterns, i.e. by the so-called ATPG software (Automated Test Pattern Generation software), for a test quality with a 95% "stuck at fault" covering, said sampling vectors being loaded serially into the scan chains. A method for testing circuit modules according to the prior art would result in 10 scan chains with in each case 5 modules×2500 flip-flop units/10 scan chains=1250 flip-flop units.

These 1250 flip-flop units per scan chain have a total memory requirement of 1000 sampling vectors×length of a scan chain of 1250 flip-flop units=1.25 MV (mega-sampling vectors).

By contrast, the method for testing circuit modules, in the exemplary embodiment illustrated, provides the possibility of loading the identically present channel modules 101a–101d with identical sampling signals, as a result of which it is now necessary to process only 5000 flip-flop units-2500 flip-flop units identically for the channel modules 101a–101d and 2500 flip-flop units for the control module 102. Given 10 scan chains, there result, in order to be comparable with the abovementioned example according to the prior art, 5000 flip-flop units/10 scan chains=500 flip-flop units.

Consequently, in the case of the 1000 sampling vectors required in accordance with the above explanations, the memory requirement is 0.5 MV (mega-sampling vectors, which corresponds to a reduction of the memory requirement by 0.75 MV or by 60%.

The illustrated arrangement having four channel modules 101a–101d which are processed by the method and the apparatus according to an embodiment is only by way of example. It is clearly apparent to average persons skilled in the art that two or more channel modules and/or two or more control modules can be tested with the aid of an embodiment of the method.

While preferred embodiments have been illustrated and described in detail in the drawings and foregoing description, the same is to be considered as illustrative and not restrictive in character, it being understood that only the preferred embodiments have been shown and described and that all changes and modifications that come within the spirit of the invention both now or in the future are desired to be protected.

What is claimed is:

1. A method for testing circuit modules, comprising the steps of:

driving at least one channel module by a test register;

driving at least one control module by the test register;

testing the at least one channel module by testing at least one scan chain of the channel module;

testing the at least one control module by testing at least one scan chain of the control module;

in each case testing multiply present channel modules which have a substantially identical scan chain structure tested with substantially identical channel sampling input signals in that channel sampling output signals obtained at a respective channel sampling output are combined in a manner dependent on channel sampling mode signals by gate units in such a way that the channel sampling output signals obtained can be fed temporally successively to a combination unit, the combination unit being designed such that only one of the gate output signals is switched through, an output signal of the combination unit is switched through to a single read-out terminal unit by a multiplexer unit in a manner dependent on a multiplexer sampling enable signal, and sampling enable signals are generated by an AND combination by a first gate unit and a second gate unit in that the sampling mode signals corresponding to the circuit modules to be tested are fed to a second input terminal of the 10 gate units;

reading out test results via the read-out terminal unit; and comparing the obtained test results with at least one desired sampling output signal for the tested channel modules by a comparator unit.

2. The method according to claim 1 wherein the at least one channel module and the at least one control module are tested temporally successively.

3. The method according to claim 1 wherein the at least one channel module and the at least one control module are tested simultaneously.

4. The method according to claim 1 wherein sampling signals are generated with aid of a program for automatic generation of test patterns.

5. A method for testing circuit modules, comprising the steps of:

driving at least one channel module by a test register;

driving at least one control module by the test register;

testing the at least one channel module by testing at least one scan chain of the channel module;

testing the at least one control module by testing at least one scan chain of the control module;

in each case testing channel modules which have a substantially identical scan chain structure tested with substantially identical channel sampling input signals in that channel sampling output signals obtained at a respective channel sampling output are combined in a manner dependent on channel sampling mode signals in such a way that the channel sampling output signals obtained can be fed successively to a combination unit, the combination unit being designed such that one of the gate output signals is switched through, an output signal of the combination unit is switched through to a read-out terminal unit by a multiplexer unit in a manner dependent on a multiplexer sampling enable signal, and sampling enable signals are generated by a first gate unit and a second gate unit in that the sampling mode signals corresponding to the circuit modules to be tested are fed to a second input terminal of the gate units;

reading out test results via the read-out terminal unit; and comparing the obtained test results with at least one desired sampling output signal for the tested channel modules.

6. An apparatus for testing circuit modules, comprising:

a test register driving at least one channel module to be tested and at least one control module to be tested;

gate units logically combining channel sampling output signals provided at channel sampling outputs of the channel module with channel sampling mode signals;

a combination unit combining gate output signals of the gate units;

a multiplexer unit switching through an output signal of the combination unit dependent on a multiplexer sampling enable signal;

a read-out terminal unit reading out a test result; and a comparator unit comparing the test results with at least one desired sampling output signal for at least one channel module and at least one desired sample output signal for at least one control module.

7. The apparatus according to claim 6 wherein a logic is provided in order to generate sampling enable signals with aid of sampling mode signals.

8. The apparatus according to claim 6 wherein the gate units combining the channel sampling mode signals with the channel sampling output signals are designed as AND gates.

9. An apparatus for testing circuit modules, comprising:

a test register driving at least one channel module to be tested and at least one control module to be tested;

combining units combining channel sampling output signals provided at channel sampling outputs of the channel module with channel sampling mode signals;

a combination unit combining output signals of the combining units;

a multiplexer unit switching through an output signal of the combination unit dependent on a multiplexer sampling enable signal;

a read-out terminal unit reading out a test result; and a comparator unit comparing the test results with at least one desired sampling output signal for at least one channel module and at least one desired sample output signal for at least one control module.

* * * * *